United States Patent
Ootsuki et al.

(10) Patent No.: US 6,302,756 B1
(45) Date of Patent: Oct. 16, 2001

(54) ORGANIC ELECTROLUMINECENT DISPLAY DEVICE SUITABLE FOR A FLAT DISPLAY AND METHOD OF FORMING THE SAME

(75) Inventors: Shigeyoshi Ootsuki; Shinichi Fukuzawa, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/542,335

(22) Filed: Apr. 5, 2000

Related U.S. Application Data

(62) Division of application No. 08/961,555, filed on Oct. 30, 1997, now Pat. No. 6,087,772.

(30) Foreign Application Priority Data

Oct. 30, 1996 (JP) .................................................... 8-287937

(51) Int. Cl.$^7$ ...................................................... H01J 9/00
(52) U.S. Cl. ............................................................ 445/24
(58) Field of Search ........................ 445/24, 58; 313/504, 313/505

(56) References Cited

U.S. PATENT DOCUMENTS

| 5,276,380 | 1/1994 | Tang . |
| 5,701,055 | 12/1997 | Nagayama et al. . |
| 5,804,917 | * 9/1998 | Takahashi et al. .................... 313/504 |
| 5,814,417 | 9/1998 | Nagayama . |
| 5,949,188 | * 9/1999 | Leising et al. ....................... 313/505 |

FOREIGN PATENT DOCUMENTS

| 63-276035 | 11/1988 | (JP) . |
| 5-275172 | 10/1993 | (JP) . |
| 8-202287 | 8/1996 | (JP) . |

* cited by examiner

*Primary Examiner*—Kenneth J. Ramsey
(74) *Attorney, Agent, or Firm*—Young & Thompson

(57) ABSTRACT

The present invention provides a display device comprising anodes provided over a substrate, isolators provided on the anodes, an organic electroluminescence layer provided over the anodes and the isolators, and cathodes provided on the organic electroluminescence layer so that the cathodes are isolated from each other by the isolators.

8 Claims, 12 Drawing Sheets

ORGANIC ELECTROLUMINECENT DISPLAY DEVICE SUITABLE FOR A FLAT DISPLAY AND METHOD OF FORMING THE SAME

CROSS-REFERENCE TO RELATED APPLICATIONS

This application is a division of application Ser. No. 08/961,555, filed Oct. 30, 1997, now U.S. Pat. No. 6,087,772.

BACKGROUND OF THE INVENTION

The present invention relates to a display device and a method of forming the same, and more particularly to an organic electroluminescent display device suitable for a flat display and a method of forming the same.

FIG. 1 is a fragmentary cross sectional elevation view illustrative of a conventional organic electroluminescent display device. The conventional organic electroluminescent display device is formed on a transparent supporting substrate 31. A transparent indium tin oxide film is provided which extends over the transparent supporting substrate 31. The transparent indium tin oxide film is patterned to be in the form of an anode 32 of the transparent indium tin oxide film. The patterning of the transparent indium tin oxide film may be carried out by photo-lithography and subsequent wet etching by use of a chemical including ferric chloride. An organic electroluminescent layer 35 is grown on the anode 32 by a vacuum evaporation method. A cathode is further formed by patterning over the organic electroluminescent layer 35.

If the patterning of the cathode is carried out by the photo-lithography and subsequent wet etching, then in removal of the photo-resist film and in the selective etching of the cathode, moisture is immersed into an interface of the cathode to the organic electroluminescent layer and further into the organic electroluminescent layer. As a result, the luminescent properties and life-time of the display device are remarkably deteriorated.

In order to avoid the above problems, it had been proposed to use a shadow mask for evaporations of organic electroluminescent materials and a cathode. In this shadow mask method, as shown in FIG. 1, a transparent electrode made of indium tin oxide is grown by a sputtering method on a transparent supporting substrate made of glass. The transparent electrode is patterned to a stripe shape to form the anode 32. A first organic electroluminescent layer 33 and a second organic electroluminescent layer 34 are sequentially laminated on an entire surface of the substrate. The organic electroluminescent layer 35 comprises laminations of the first and second organic electroluminescent layers 33 and 34. The shadow mask may be made of a metal and has stripe shielding portions 36 defined by slits. The shadow mask is aligned so that the slits cross over the patterns of the anode 32 so as to be in contact with the organic electroluminescent layer 35 over the transparent substrate 31. Thereafter, the cathode material is vacuum-evaporated on the organic electroluminescent layer 35 and on the stripe shielding portions 36 of the shadow mask.

Japanese laid-open patent publication No. 5-275172 discloses an organic electroluminescent display device and a method of forming the same. Anode lines of indium tin oxide are arranged at a constant distance to extend laterally over the transparent substrate. Walls are further provided at a constant distance to extend in a vertical direction to the anode lines. An organic electroluminescent layer is provided on the indium tin oxide anode lines and the walls over the transparent substrate. The walls have a height higher than the thickness of the organic electroluminescent layer. Thereafter, a metal source for vapor phase deposition is set at an angle for allowing each of the walls to be inserted between the source and the organic electroluminescent layer for deposition of the metal film to form a cathode.

The walls comprise a spin-coated negative photo-resist or a dry film. The spin-coated negative photo-resist or the dry film is exposed to a light pattern for selective cross-linking of the exposed part of the photo-resist to be insoluble and development and cleaning of the unexposed part of the photo-resist for selective removal thereof to form the photo-resist walls.

Alternatively, it is also disclosed that the photo-resist is selectively provided by patterning onto the areas surrounding the walls to be formed. Wall materials such as silica, silicon nitride, alumina are applied on the wall formation areas for subsequent solvent lift-off method to remove the photo-resist to form the walls.

If the metal for the cathode is vacuum-evaporated, the metals are removed along the walls inserted into between the organic electroluminescent layer and the walls whereby the cathode has the desired pattern.

The organic electroluminescent display device has pairs of anode and cathode in the form of pixels and a voltage of 5–20V is applied across the anode and cathode to apply a current through the organic electroluminescent layer for luminescence of the patterns.

The above conventional organic electroluminescent display device has a sandwich structure of the organic electroluminescent layer sandwiched between the anode and cathode. The anode and cathode are required to have the desired patterns for the luminescence of the organic electroluminescent layer by applying the voltage across the anode and cathode for the desired pattern display. In dot-matrix display, the electrodes are patterned so that the anodes and the cathodes are arranged to cross to each other in the form of matrix.

As described above, it is easy to carry out the patterning of the anode over the transparent supporting substrate. The problem is in the formation of the cathode 37 by patterning over the organic electroluminescence layer. If the cathode 37 is formed by the photo-lithography and subsequent wet etching, then in the removal of the photo-resist and in the selective etching to the cathode by the photo-resist, moisture is immersed into the organic electroluminescent layer and into the interface between the organic electroluminescence layer and the cathode whereby the luminescence properties and the life-time are remarkably deteriorated.

In order to avoid the above problem, there are a method of using a shadow mask over the organic electroluminescent layer for the formation of the cathode or a method of use of the photo-resist to form the walls which are to be used for patterning of the cathode.

In the former method of using the shadow mask, if the substrate size is large, then the dead weight of the shadow mask makes it difficult to have the contact with the organic electroluminescent layer at a center of the transparent substrate. As a result, the cathode is not isolated to form a short circuit. It is difficult to make an accurate patterning of the cathode. If the substrate size is not so large but the fine pattern is required, it is required to have the shadow mask thin. However, the thin shadow mask has an insufficient rigidity thereby resulting in difficulty in contact with the organic electroluminescent layer over the substrate.

In the above circumstances, it was proposed that the thin shadow mask is made of magnetic material so that the magnet is provided on an opposite surface to the surface of the transparent substrate on which the organic electroluminescent layer is provided whereby the stripe shielding portions 36 of the shadow mask are forced by the magnetic force to be in contact with the organic electroluminescent layer. The shadow mask contacts to the organic electroluminescent layer thereby damaging the organic electroluminescent layer. Since the organic electroluminescent layer is not more than 1 micrometers to suppress the driving voltage to not less than 20V, the damage 38 extends to the anode 32. If, as illustrated in FIG. 1, the damage 38 is positioned at a site where the cathode 37 should be patterned, then in the cathode formation process, the metal for the cathode is contact through the damage 38 to the anode 32 thereby forming a short circuit between the anode and cathode. As a result, the necessary voltage for luminescence is not applied to the organic electroluminescent layer. Thus, no luminescence appears on the display pixel. This reduces the yield of the display device.

On the other hand, in the later method of using the walls of the photo-resist, it is required that the walls are positioned between the organic electroluminescent layer and the evaporation metal source for the cathode formation, for which reason a large vacuum growth chamber is required for patterning of the cathode over the large transparent supporting substrate. This method is somewhat expensive.

Adjacent two cathodes are distanced from each other by an isolation distance of the sum of the width of the wall and the width of the region of the organic electroluminescent layer on which the wall sandwiched between the evaporation metal source for the cathode formation and the organic electroluminescent layer is projected. For this reason, in the large scale display substrate, the isolation distance is different between the close and far positions to the evaporation metal source for the cathode formation.

Further, in the substantially parallel pattern to a straight line connecting the substrate and the evaporation metal source for the cathode formation, no wall projecting portion exist on the organic electroluminescent layer whereby it is impossible to carry out the patterning of the cathode.

In the above circumstances, it had been required to develop a novel organic electroluminescent display device free from the above problems.

SUMMARY OF THE INVENTION

Accordingly, it is an object of the present invention to provide a novel organic electroluminescent display device free from the above problems.

It is a further object of the present invention to provide a novel organic electroluminescent display device suitable for facilitation of fine patterning of a cathode even if a large size display device.

It is a still further object of the present invention to provide a novel organic electroluminescent display device suitable for allowance of desired patterning of a cathode.

It is yet a further object of the present invention to provide a novel organic electroluminescent display device suitable for allowance of reduction in manufacturing cost thereof.

The above and other objects, features and advantages of the present invention will be apparent from the following descriptions.

The present invention provides a display device comprising anodes provided over a substrate, isolators provided on the anodes, an organic electroluminescent layer provided over the anodes and the isolators, and cathodes provided on the organic electroluminescent layer so that the cathodes are isolated from each other by the isolators.

The present invention provides a method of forming a display device comprising the steps of: providing anodes over a substrate; providing isolators on the anodes; providing an organic electroluminescence layer over the anodes and the isolators; provided a shadow mask with stripe shielding portions which are in contact with the isolators; forming a deposition of a metal using the shadow mask to form cathodes on the organic electroluminescent layer so that the cathodes are isolated from each other by the isolators.

BRIEF DESCRIPTION OF THE DRAWINGS

Preferred embodiments according to the present invention will be described in detail with reference to the accompanying drawings.

PREFERRED EMBODIMENTS

Figure 1:
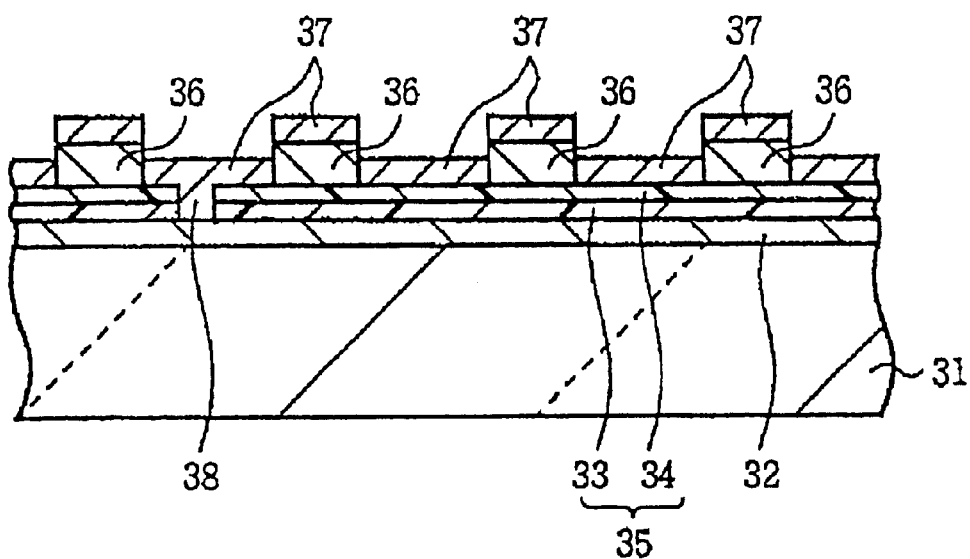
FIG. 1 is a cross sectional elevation view illustrative of the conventional organic electroluminescent display device.
Figure 2:
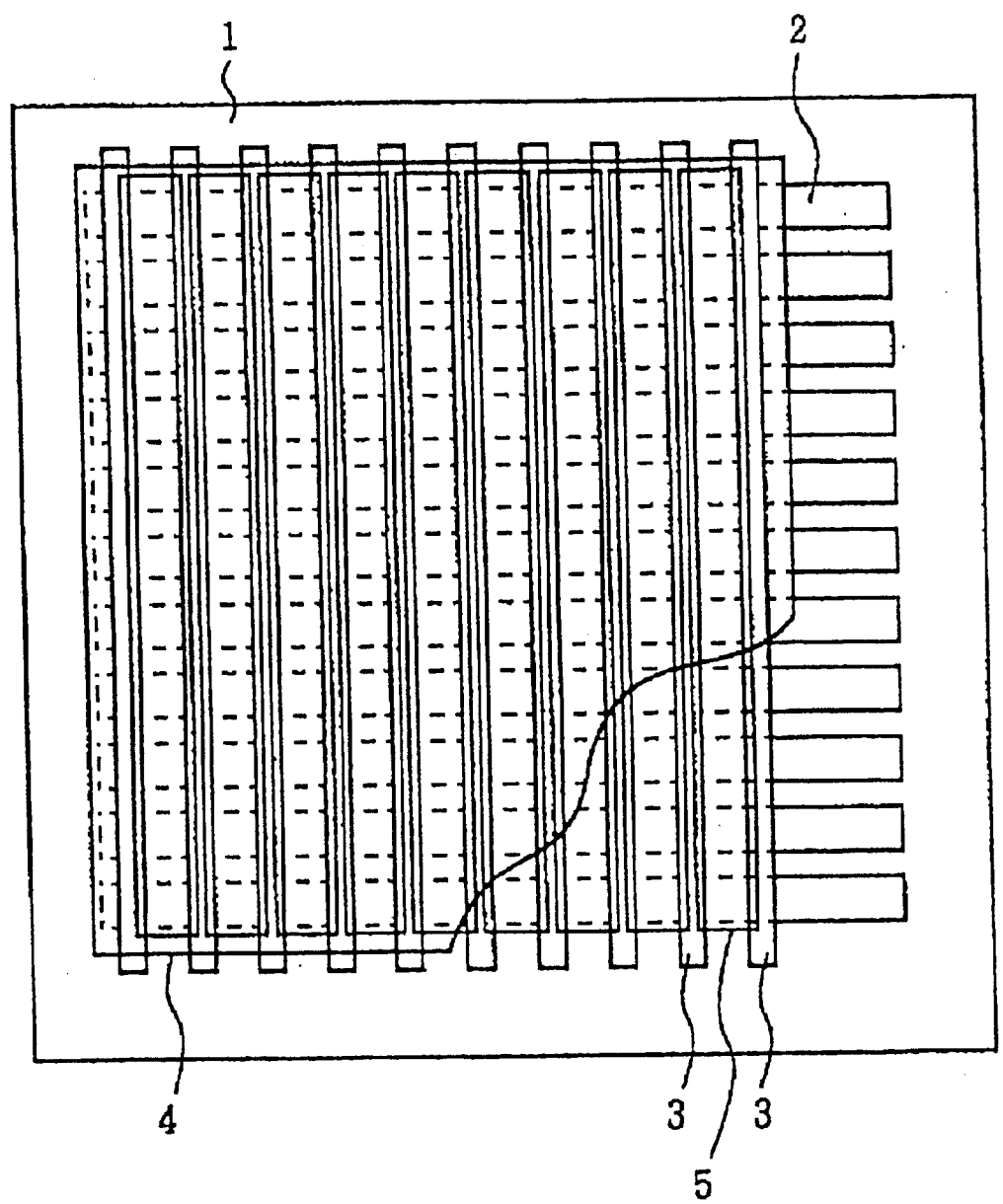
FIG. 2 is a plan view illustrative of a novel organic electroluminescent display device in a first embodiment according to the present invention.

A first embodiment in accordance with the present invention will be described as follows. As shown in FIG. 2, a transparent glass substrate 1 is used which has a thickness of 1.1 millimeters. An indium tin oxide film having a thickness of 100 nanometers is deposited by a sputtering method on the transparent substrate 1. The above glass substrate 1 is preferably no-alkali glass with low absorption of moisture. Low alkali glass plate or soda lime glass plate are also available provided that the substrate is kept from moisture.

The indium tin oxide film is patterned by photolithography and subsequent etching to be in the form of stripes horizontally extending at a distance thereby to form an anode 2. The indium tin oxide film is preferably low in resistance as acting to be the anode. The indium tin oxide film is preferably highly transparent as the light of luminescence from the organic electroluminescent layer is transmitted through the indium tin oxide film to the exterior for display. The pattern of the indium tin oxide film is defined by a line pitch of 1.0 millimeter, a line width of 0.6 millimeters and a length of 45 millimeters and has 128 columns. The lines of the anodes 2 comprise rows of the display device.

Isolation walls 3 are formed which cross over the anodes 2. The pattern of the isolation walls 3 is defined by a line pitch of 1.0 millimeter, a line width of 0.4 millimeters and a height of 40–50 micrometers. The lines of the isolation walls 3 comprise columns of the display device.

A squared organic luminescent layer 4 is formed by a vacuum evaporation. Thereafter, a shadow mask with slits defined between the isolation walls 3 is then used for vacuum evaporation of a metal to form cathodes 5 which are in the form of columns.

Fabrication processes for the above novel organic electroluminescent display device will be described with reference to FIGS. 3A through 3F.

Figure 3A:
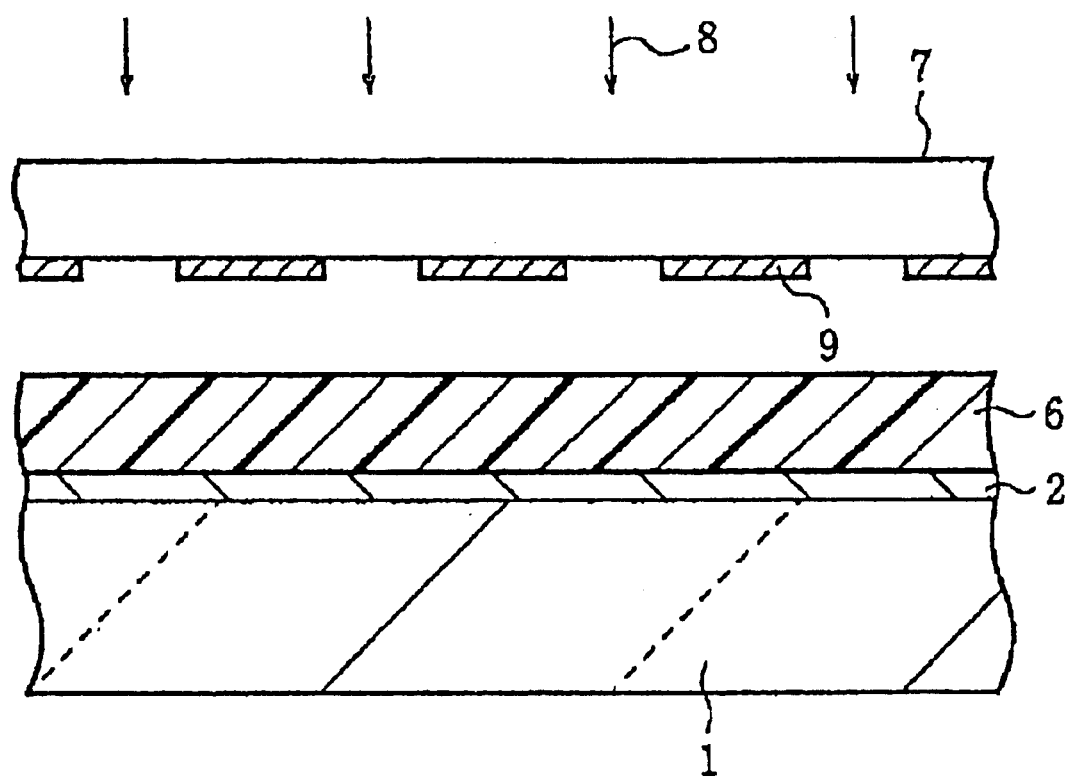
FIGS. 3A through 3E are fragmentary cross sectional elevation views illustrative of novel organic electroluminescent display devices in sequential steps involved in a novel fabrication method in a first embodiment in accordance with the present invention.

With reference to FIG. 3A, the stripe-shaped anodes 2 are formed over the transparent substrate 1. The stripe-shaped anodes 2 may be made of indium tin oxide. A negative dry film resist 6 is laminated by a laminator over the stripe-shaped anodes 2 and over the transparent substrate 1. A photo-mask 7 is used for irradiation of a near ultraviolet ray 8 so that transcription of strip-shaped optical patterns is made through the photo-mask 7 onto the negative dry film resist 6. The negative dry film resist 6 is alpha-450 commercially available from Tokyo Applied Industry Co. The negative dry film resist 6 is laminated at a temperature of 85–115° C. under a pressure of 2–4 kg/cm$^2$ at a lamination rate of 1–3 meters per one minute. The photo-mask 7 has shielding patterns 9 which extend cross over the indium tin oxide stripes. The shielding patterns 9 have a width of 0.4 millimeters and are aligned at a pitch of 1.0 millimeter. The shielding patterns 9 comprise 31 stripes. Outside the opposite two stripes, sufficiently wide shielding patterns are provided at a distance by 0.6 millimeters from the opposite two stripes.

Figure 3B:
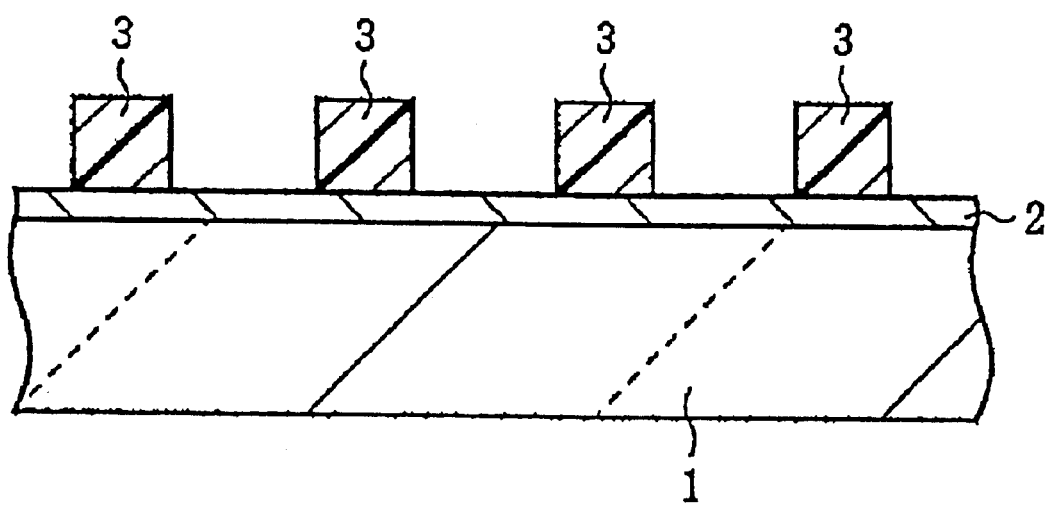

The dry film resist is exposed to the near ultraviolet ray 8 for selective cross-linking of the exposed part of the dry film resist to be insoluble and development and cleaning of the unexposed part of the dry film resist for selective removal thereof to form the dry film resist walls 3. The development is made using a solution including 0.8–1.2% of $Na_2CO_3$. The removal and cleaning are made by use of a solution of 2–4% of KOH. The development and subsequent removal and cleaning processes are made at a rotation of 400 rpm, wherein the dry film resist faces down. The developer and removal solution are sprayed onto the resist. After removal, the sample rotates at 300 rpm for 60 seconds for subsequent drying the same in a clean oven at a 130 for 60 minutes. As shown in FIG. 3B, the column lines of the isolation walls of the dry film resist are formed over the transparent supporting substrate. The height of the isolation walls is not limited unless the shadow mask is kept from the contact with the organic electroluminescent layer. Considering that the strength of the normal photo-resist, the thickness of the dry film resist is preferably 10–200 micrometers.

The isolation walls are faced down so that the transparent supporting substrate 1 is fixed on a substrate holder in a vacuum evaporation system. N,N'-diphenyl-N,N'-bis(alpha-naphthyl)-[1,1'-biphenyl]4,4'-diamine (hereinafter referred to as alpha-NPD) is put into a resistive heating boat in the vacuum evaporation system. Tris(8-quinolinolato)aluminum complex (hereinafter referred to as Alq3) is put into the other resistive heating boat. The vacuum chamber is vacuumed by vacuum pump to $1\times10^{-6}$ Torr or less.

Figure 3C:
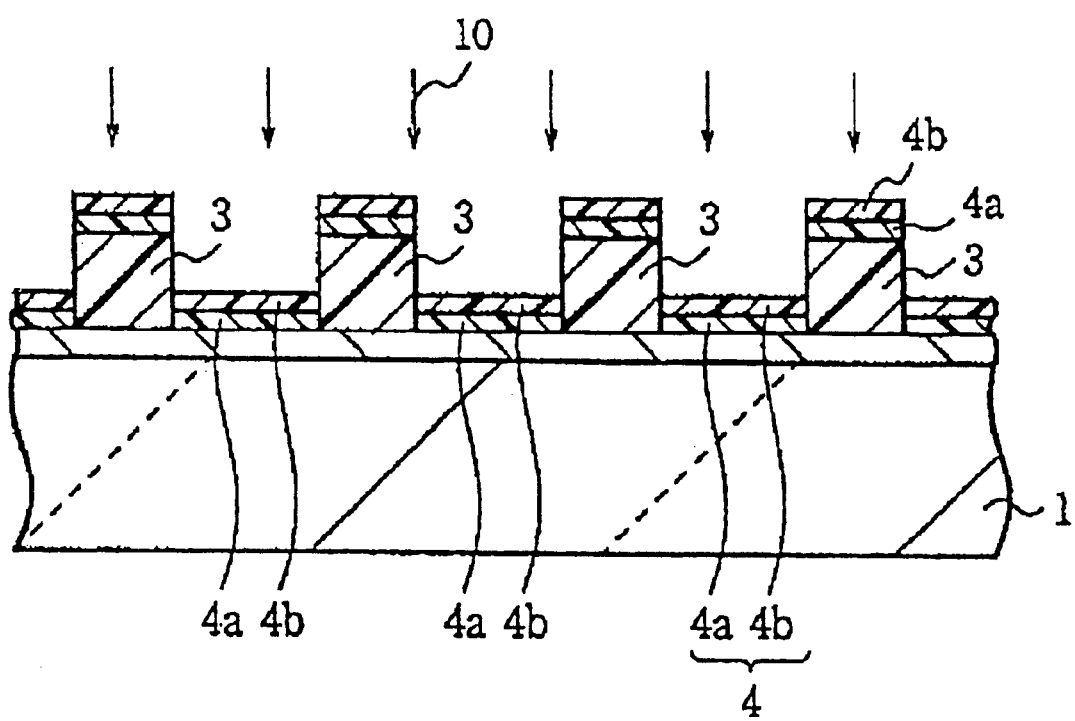

With reference to FIG. 3C, the metal mask having a square-opening for evaporation of organic electroluminescent layer is aligned over the isolation walls 3 over the substrate 1. Alpha-NPD containing resistive heating boat is applied with a current for heating the same for evaporation of alpha-DPN layer 4a of about 50 nanometers. Thereafter, the Alq3 containing resistive heating boat is applied with a current for heating the same for evaporation of Alq3 layer 4b of about 50 nanometers. As a result, the organic electroluminescent layer 4 is formed which comprises laminations of alpha-NPD layer 4a and Alq3 layer 4b. The alpha-DPN layer 4a acts as a hole transport layer whilst the Alq3 layer 4b acts as an electron transport layer and also acts as a electroluminescent layer.

As shown in FIG. 3C, the direction of the evaporation of the organic molecules 10 for the alpha-NPD layer 4a and Alq3 layer 4b is vertical. Notwithstanding, to prevent shielding by the isolation walls 3 and to obtain uniformity in thickness of the evaporated film, it is preferable to rotate, in plane to the evaporation source, the substrate 1 during the evaporation.

Figure 4:
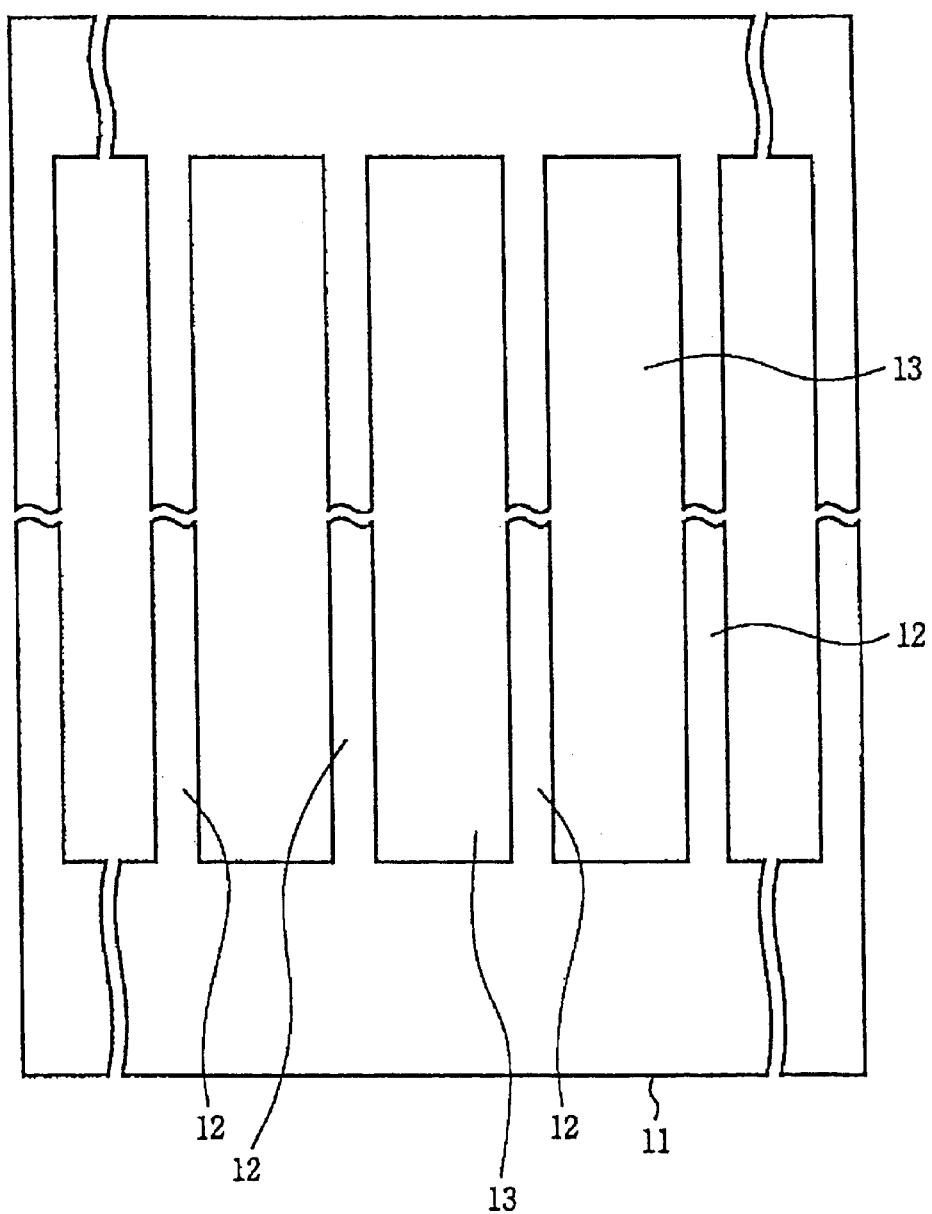
FIG. 4 is a plan view illustrative of a shadow mask used for fabrication of a novel organic electroluminescent display device in a first embodiment in accordance with the present invention.

A shadow mask 11 of SUS430 shown in FIG. 4 is pre-set in the vacuum evaporation system. Over the shadow mask 11, the substrate 11 with the organic electroluminescent layer 4 are set. The shadow mask 11 is provided with stripe-shaped shielding portions 12 and slits 13 so that the stripe-shaped shielding portions 12 are positioned in correspondence to the column lines of the isolated walls over the transparent supporting substrate 1. The shadow mask 11 has a size of a thickness of 0.4 millimeters, a width of 0.4 millimeters, and a length of 130 millimeters. The stripe-shaped shielding portions 12 have a center pitch of 1.0 millimeter. Thirty two of the stripe-shaped shielding portions 12 are provided in parallel to each other.

Figure 3D:
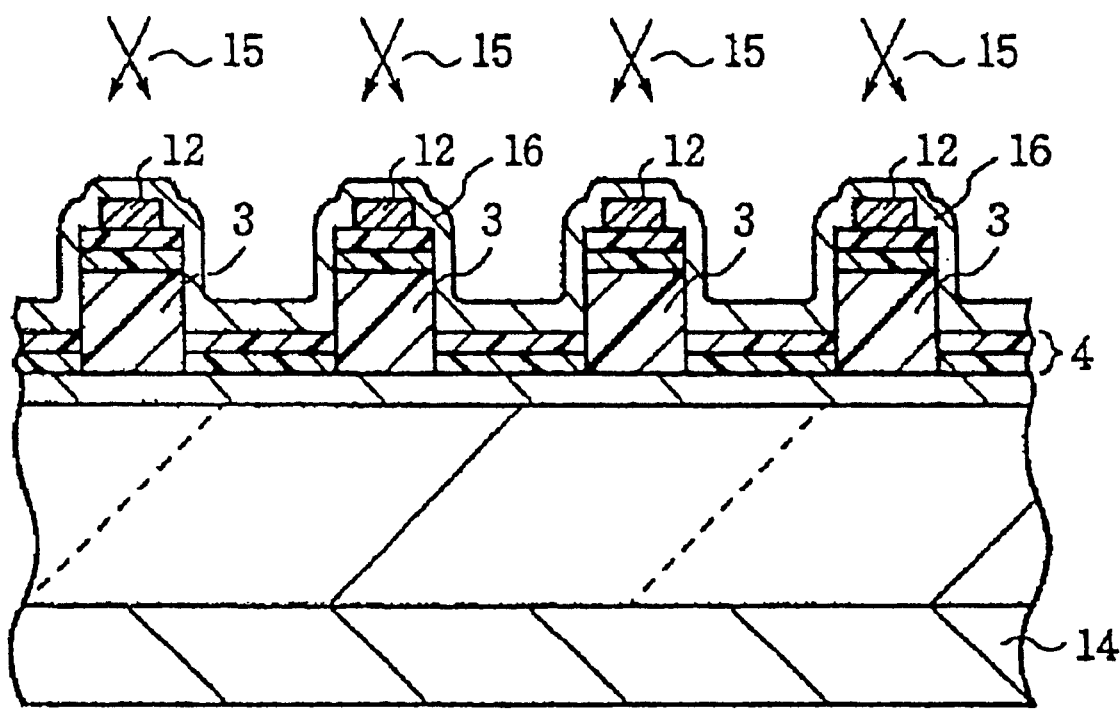

With reference to FIG. 3D, the stripe-shaped shielding portions 12 of the shadow mask 11 are securely fixed on the isolation walls 13 by use of magnetic force of a magnet. The shadow mask 11 is made of a magnetic material to be attracted to the magnet 14.

Magnesium is put into the resistive heating boat in the vacuum evaporation system. Silver is put into the other resistive heating boat in the vacuum evaporation system. Magnesium and silver are concurrently evaporated at such an evaporation speed that a ratio of magnesium to silver is 10:1. Evaporation metal 15 from the evaporation source are evaporated in substantially symmetrical direction. It is preferable to rotate the substrate 1 in plane to the evaporation source during the evaporation. An alloy layer 16 having a thickness of 200 nanometers is formed which coats the isolation walls 3, the organic electroluminescent layer 4 and the stripe-shaped shielding portions 12.

Figure 3E:
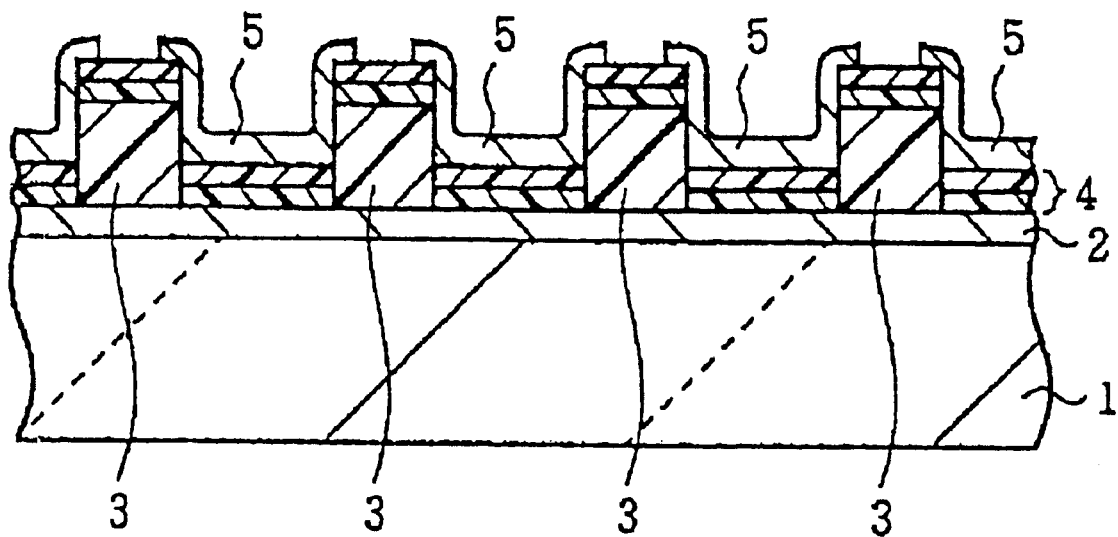

With reference to FIG. 3E, the substrate 1 is distanced from the shadow mask 11 so that without picking up the substrate 1 from the vacuum chamber 32 cathodes 5 may be made from magnesium-silver substance thereby forming the display device.

In accordance with the present invention, it is possible to have the shadow mask in secure contact with the substrate surface, for which reason the shadow mask is not in contact with the organic electroluminescence layer. No damage is given to the organic electroluminescence layer by the shadow mask.

Pulse voltages of 8V are applied across the indium tin oxide anodes and the magnesium-silver cathodes so that the cathodes are scanned in time-division at a duty factor of 1/32 and a frame frequency of 150 Hz. Non-selected cathodes are applied with +8V whilst the selected cathode is applied with 0V. In synchronous to the scanning timing of the cathodes, pulse currents of 300 mA/cm2 with a maximum voltage of 8V are applied from the constant current circuit to the anode connected to a light-on pixel, whilst the anodes connected to light-off pixels are applied with 0V. In normal room, the desired patterns can be observed at pixel brightness or luminance.

Figure 5:
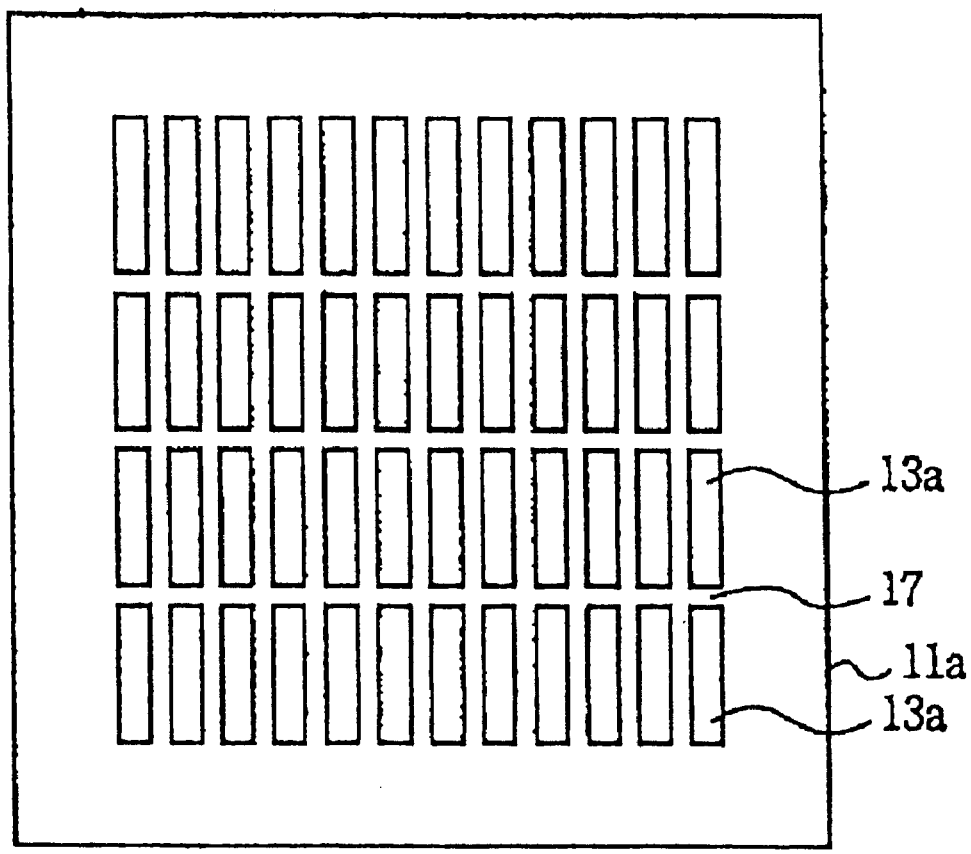
FIG. 5 is a plan view illustrative of another shadow mask used for fabrication of a novel organic electroluminescent display device in a first embodiment in accordance with the present invention.
Figure 6:
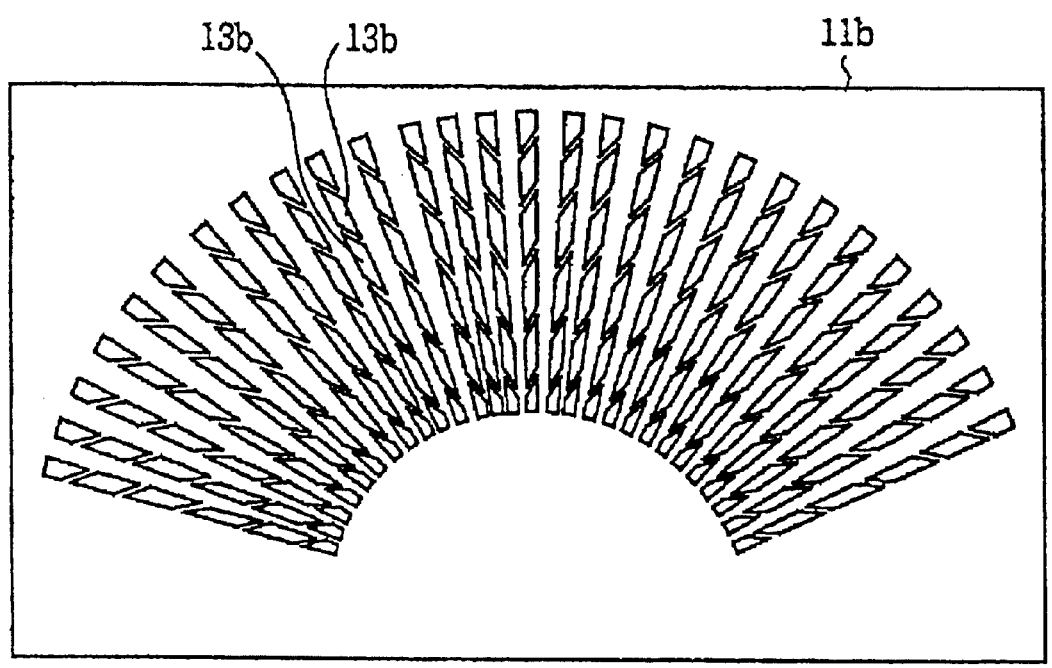
FIG. 6 is a plan view illustrative of still another shadow mask used for fabrication of a novel organic electroluminescent display device in a first embodiment in accordance with the present invention.

In place of the above shadow mask shown in FIG. 4, other shadow masks shown in FIGS. 5 and 6 are also available. The shadow mask of FIG. 5 has many strip-shaped slits 13a which are bounded by bridges 17.

In the above process of FIG. 3D, the shadow mask of FIG. 5 is available. The height of the isolation walls 3 is 40–50 micrometers, for which reason although the shadow mask has the bridges 17, the metals are evaporated in vertical and oblique directions onto the positions under the bridges 17. The thickness of the organic electroluminescence is less than 1 micrometer, for which reason a distance from a surface of the organic electroluminescence layer to a top surface of the shadow mask is bout 40–50 micrometers. When the substrate 1 is rotated in the vacuum evaporation system, the direction of the metal evaporation onto the organic electroluminescence layer from the source is kept to have an oblique angle of not less than 50 degrees so that the metal layer may be evaporated under the bridge 17 with a width of 20 micrometers.

Still another shadow mask shown in FIG. 6 is also available. The shadow mask has many slits 13b align in fan-shape. The slits 13b are supported by bridges in mesh. For this reason, the thin metal plate of 50 micrometers in thickness may be used for the shadow mask. The available width of the bridges, the height of the isolation walls and a thickness of the shadow mask are determined in consideration of an oblique angle of the evaporation direction. In view of strength of the shadow mask, the thickness of the shadow mask is preferably 50 micrometers or more. In this case, the bridge width is preferably 20 micrometers or more. The height of the isolation wall is preferably 40 micrometers or more.

Figure 7A:
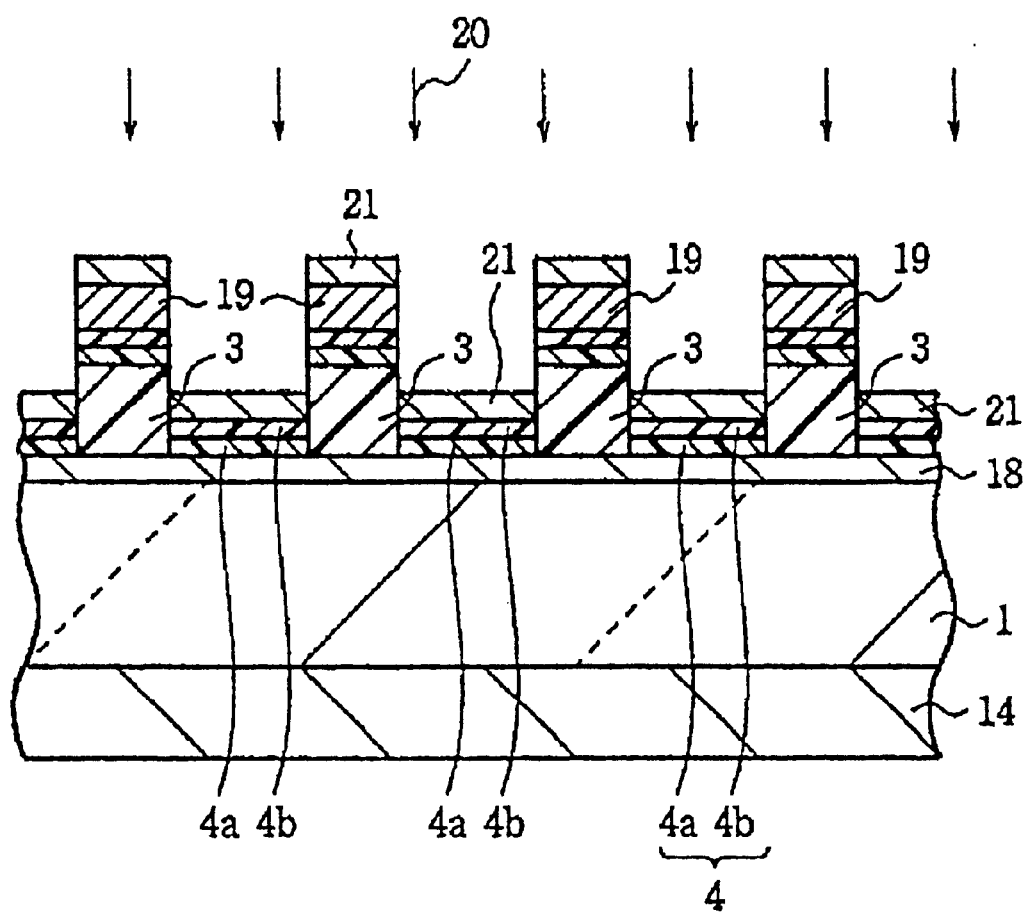
FIGS. 7A through 7B are fragmentary cross sectional elevation views illustrative of novel organic electroluminescent display devices in sequential steps involved in a novel fabrication method in a second embodiment in accordance with the present invention.

A second embodiment in accordance with the present invention will be described as follows. As shown in FIG. 7A, an indium tin oxide film is patterned by photo-lithography and subsequent etching to be in the form of stripes horizontally extending at a distance thereby to form an anode 18. The pattern of the indium tin oxide film is defined by a line pitch of 0.35 millimeter, a line width of 0.25 millimeters and a length of 29 millimeters and has 256 columns The lines of the anodes 2 comprise columns of the display device.

A negative dry film resist is laminated by a laminator over the stripe-shaped anodes 2 and over the transparent substrate 1. A photo-mask is used for irradiation of a near ultraviolet ray so that transcription of strip-shaped optical patterns is made through the photo-mask onto the negative dry film resist. 63 row lines of the isolation walls of the dry film resist are formed to have width of 0.1 millimeter and over the transparent supporting substrate at a pitch of 0.35 millimeters. The height of the isolation walls is not limited unless the shadow mask is kept from the contact with the organic electroluminescent layer. Considering that the strength of the normal photo-resist, the thickness of the dry film resist is preferably 40–50 micrometers. Outside the opposite two stripes, sufficiently wide shielding patterns are provided at a distance by 0.6 millimeters from the opposite two stripes.

The organic electroluminescence layer 4 is formed which comprises laminations of alpha-NPD layer 4a and Alq3 layer 4b. The alpha-NPD layer 4a acts as a hole transport layer whilst the Alq3 layer 4b acts as an electron transport layer and also acts as a luminescence layer.

The shadow mask is securely fixed on the isolation walls 13 by use of magnetic force of a magnet. The shadow mask 11 is made of a magnetic material to be attracted to the magnet 14.

A magnesium-silver alloy layer is formed which coats the isolation walls 3, the organic electroluminescent layer 4 and the stripe-shaped shielding portions 19.

Figure 7B:
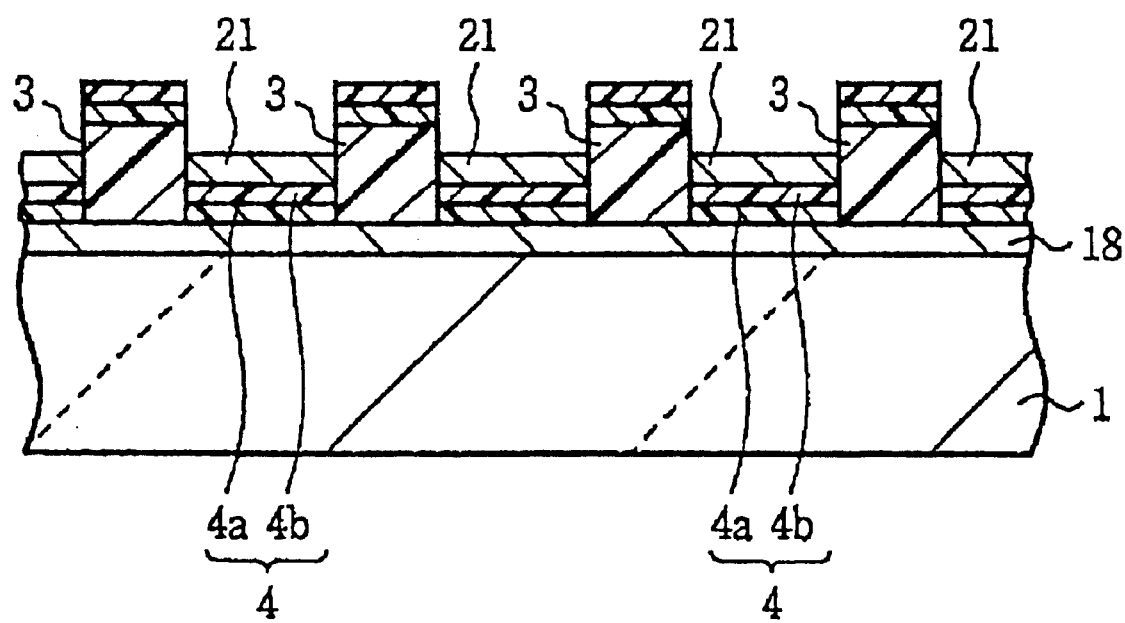

With reference to FIG. 7B, the substrate 1 is distanced from the shadow mask so that without picking up the substrate 1 from the vacuum chamber 32 cathodes 21 may be made from magnesium-silver substance thereby forming the display device.

The above method of the second embodiment is suitable for a narrow pitch electrode arrangement such as 0.35 millimeters.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a display device comprising the steps of:
   providing anodes over a substrate;
   providing isolators on said anodes;
   providing an organic electroluminescence layer over said anodes and said isolators;
   provided a shadow mask with stripe shielding portions which are held on said isolators with magnetic force;
   forming a deposition of a metal using said shadow mask to form cathodes on said organic electroluminescence layer so that said cathodes are isolated from each other by said isolators.

2. The method as claimed in claim 1, wherein said stripe shielding portions of said shadow mask are defined by slits formed on said shadow mask.

3. A method of making a display device, comprising the steps of:
   forming anodes on a top surface of a substrate;
   forming isolation walls on and transverse to the anodes;
   forming an electroluminescent (EL) layer on top surfaces of the anodes and on top surfaces of the isolation walls;
   attaching stripes of a striped shadow mask on portions of the EL layer on the top surfaces of the isolation walls;
   depositing striped cathodes on the EL layer that is on the top surfaces of the anodes, on sides of the isolation walls, and on portions of the top surfaces of the isolation walls other than the portions on which the shadow mask is attached; and
   removing the shadow mask.

4. The method of claim 3, wherein the stripes of the striped shadow mask are held on the portions of the EL on the top surfaces of the isolation walls with magnetic force.

5. A method of making a display device, comprising the steps of:
   forming anodes on a top surface of a substrate;
   forming isolation walls on and transverse to the anodes;
   forming an electroluminescent (EL) layer on top surfaces of the anodes and on top surfaces of the isolation walls;

using magnetic force to hold stripes of a striped shadow mask on portions of the EL layer on the top surfaces of the isolation walls;

depositing striped cathodes on the EL layer that is on the top surfaces of the anodes and on portions of the top surfaces of the isolation walls other than the portions on which the shadow mask is held; and removing the shadow mask.

6. The method of claim 5, further comprising the step of attaching a magnet to a surface of the substrate opposite the top surface, and wherein the shadow mask comprises a magnetic material.

7. The method of claim 1, further comprising the step of attaching a magnet to the substrate on a surface opposite a surface on which the anodes are provided, and wherein the shadow mask comprises a magnetic material.

8. The method of claim 1, wherein the steps of providing the anodes and isolators are taken outside a vacuum chamber while the steps of providing the organic electroluminescence layer and the shadow mask and the step of depositing the metal forming the cathode are taken sequentially in the vacuum chamber.

* * * * *